(12) United States Patent
Wood et al.

(10) Patent No.: US 7,239,671 B2
(45) Date of Patent: Jul. 3, 2007

(54) SYSTEM AND METHOD FOR DIGITAL TIMING ERROR CORRECTION IN A COMMUNICATIONS SYSTEM UTILIZING ADAPTIVE PREDISTORTION

(75) Inventors: Steven A. Wood, Bristol (GB); Ian Johnson, Bristol (GB); Christian G. Luke, Bristol (GB); Adrian Mansell, Bristol (GB); Mark Cope, Bath (GB)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 11/175,509

(22) Filed: Jul. 6, 2005

(65) Prior Publication Data

US 2006/0008026 A1    Jan. 12, 2006

Related U.S. Application Data

(60) Provisional application No. 60/586,906, filed on Jul. 9, 2004.

(51) Int. Cl.
*H04K 1/02* (2006.01)
(52) U.S. Cl. .................. 375/296; 330/149
(58) Field of Classification Search .......... 375/297, 375/296, 149, 130, 139, 147, 150; 330/149, 330/2, 107; 341/110; 455/63.1, 522, 69; 332/103
See application file for complete search history.

(56) References Cited

U.S. PATENT DOCUMENTS

| | | | |
|---|---|---|---|
| 6,072,364 A * | 6/2000 | Jeckeln et al. ............ 330/149 |
| 6,134,286 A | 10/2000 | Chennakeshu et al. ..... 375/365 |
| 6,388,518 B1 * | 5/2002 | Miyatani .................... 330/149 |
| 6,445,756 B1 | 9/2002 | Takahashi ................... 375/343 |
| 6,614,834 B1 * | 9/2003 | Meng et al. ................ 375/149 |
| 6,677,870 B2 * | 1/2004 | Im et al. .................... 341/110 |
| 6,734,731 B2 * | 5/2004 | Cavers et al. .............. 330/149 |
| 6,741,662 B1 * | 5/2004 | Francos et al. ............ 375/297 |
| 2002/0065048 A1 * | 5/2002 | Nagatani et al. ............ 455/63 |
| 2002/0171485 A1 * | 11/2002 | Cova ......................... 330/149 |
| 2006/0008030 A1 * | 1/2006 | Luke et al. ................. 375/298 |

FOREIGN PATENT DOCUMENTS

EP    001089452 A1 *   4/2001

OTHER PUBLICATIONS

Franks, L.E., Carrier and Bit Synchronization in Data Communication—A Tutorial Review; IEEE Transactions on Communications, vol. 28, Issue: 8, Aug. 1980, pp. 1107-1121.
Farrow, C.W., A Continuously Variable Digital Delay Element; IEEE International Symposium, Jun. 7-9, 1988, vol. 3, pp. 2641-2645.

(Continued)

*Primary Examiner*—Temesghen Ghebretinsae
(74) *Attorney, Agent, or Firm*—Myers Dawes Andras & Sherman LLP

(57) ABSTRACT

A system and method for rapidly correcting the time difference between two signals is disclosed. In particular, a system and method for very rapidly correcting timing errors to the very high degree of accuracy required for digital predistortion adaptation is disclosed. The method is a signal processing technique, which can be performed in either hardware or software, which employs a correlation computation. The correlation results are processed in a manner that enables very rapid and accurate estimation of the time difference between the two signals.

18 Claims, 4 Drawing Sheets

OTHER PUBLICATIONS

Simon, Marvin K. et al., Spread Spectrum Communications Handbook, McGraw-Hill 2001, ISBN 0-07-138215-1, Chapter 2, pp. 901-905.

Viterbi, Andrew J., CDMA: Principles of Spread-Spectrum Communication, Addison-Wesley Wireless Communications, 1995, ISBN 0-201-63374-4, pp. 60-67.

Erup, Lars et al., Interpolation in Digital Modems-Part II: Implementation and Performance, IEEE Transactions on Communications, vol. 41, No. 6, Jun. 1993, pp. 998-1008.

Proakis, John G., et al., Digital Signal Processing: Principles, Algorithms and Applications, 3$^{rd}$ Ed, Prentice-Hall, N.J., pp. 118-122.

* cited by examiner

SYSTEM AND METHOD FOR DIGITAL TIMING ERROR CORRECTION IN A COMMUNICATIONS SYSTEM UTILIZING ADAPTIVE PREDISTORTION

RELATED APPLICATION INFORMATION

The present application claims priority under 35 USC Section 119(e) to provisional application Ser. No. 60/586,906 filed Jul. 9, 2004, the disclosure of which is incorporated herein by reference in its entirety.

FIELD OF THE INVENTION

This invention is related to wireless communications systems and methods. In particular, the invention is related to cellular communications systems and methods, and more generally to systems that require linearization techniques to be applied to the transmit amplifier.

BACKGROUND OF THE INVENTION

Most Radio Frequency (RF) amplifier systems exhibit nonlinearity. The effect of the nonlinearity is to produce distortion of the amplified signal that reduces the performance of the signal receiver, produces energy outside of the intended band of operation of the system, or interferes with adjacent carrier frequencies. These problems are particularly important in cellular telephony systems such as GSM, UMTS, cdma2000, and IS-95.

One way to reduce the level of distortion produced at the output of an amplifier is to operate the amplifier in a more linear region of its response. The disadvantage of this approach is that the amplifier operates in a 'backed-off' mode, which means that the amplifier uses energy from its power supply very inefficiently through wasted heat. Energy efficiency, and heat dissipation, are important factors in selecting equipment for use in cellular systems.

Other more advanced methods used to reduce the level of distortion are called linearization techniques. The two most common techniques are feedforward linearization and digital predistortion.

Digital predistortion has a number of advantages, however, a known problem exists in using digital predistortion for reducing distortion by linearization of the amplifier system. Typically in such systems, there is a digitally represented 'desired' output signal that is provided as the input to the amplifier system. At the same time, there is also a digitally represented 'obtained' signal that is taken from the actual amplifier output and passed back to the digital predistortion system. The goal of the digital predistortion system is to minimize the difference between the 'obtained' signal and the 'desired' signal. The minimization is made by correcting time-variant and time-invariant distortions in the amplifier, and its associated frequency-conversion circuits, using a process commonly called adaptation. In order for the adaptation to proceed, it is vital that the desired input signal and the obtained output signal are aligned very accurately in time. Unfortunately the delays through the amplifier analog circuits are variable from amplifier unit to amplifier unit. The delays also vary as the amplifier changes temperature and they also vary as the amplifier ages.

Since the delay through the amplifier cannot be known at manufacture for the lifetime of the amplifier, the digital predistortion system must both estimate the timing offset and correct it automatically. The usual methods for performing such timing error estimation and correction, known as delay-locked loops, are well known to those skilled in the art of radio modem design. However, there are drawbacks to the existing methods that are specific to the problem of predistortion. First of all, delay-locked loops are sensitive to input power. The loop-gain of the delay-locked loop is a function of the power of the 'desired' signal and the 'obtained' signal. Therefore, it is difficult to design a delay-locked loop that will converge quickly with the very low estimation error required for digital predistortion systems. Also, delay-locked loops are sensitive to the statistics of the input signal. In multi-carrier systems, the digital predistortion system and the amplifier must be capable of supporting more than one signal carrier. The loop gain and capture range of the delay-locked loop also depend upon the number of carriers that are active in the system. In some cases with many carriers, or when there are two carriers that are separated in frequency sufficiently, the capture-range of the delay-locked loop may be too low to reliably 'pull in' all expected timing errors. Also, there is an unavoidable trade-off in a delay-locked loop between the time to converge and the subsequent noise in the converged timing delay estimate. Many digital predistortion systems are required to be fully operational in as short a time as possible. This places design constraints upon the achievable timing error estimation precision that can be obtained with a delay-locked loop.

The prior art methods for timing error estimation are suitable for wireless receiver design where the accuracy of the timing error estimate is not of primary importance. In a predistortion system, the goal is to minimize the differences between the 'desired' and the 'obtained' signal. Therefore, any differences between the 'desired' and the 'obtained' signal that are due to slight timing differences must be minimized as much as possible. This is a much more stringent timing requirement than is usual in receiver systems.

Accordingly, a need presently exists for an improved system and method for timing error estimation and correction in a predistortion linearized wireless communication system.

SUMMARY OF THE INVENTION

In a first aspect the present invention provides a method for timing error correction in an adaptive predistortion linearized communications system. The method comprises receiving an input signal comprising discrete signal samples from an input to the communications system, receiving an output signal comprising discrete signal samples from an output of the communications system, and estimating a timing delay between said input and output signals to a fraction of a sample timing. The method further comprises correcting the timing error between the input and output signals using the estimated timing delay.

In a preferred embodiment of the method, estimating a timing delay comprises computing a cross-correlation function between the input and output samples and determining the position of the peak of the cross-correlation function. The values of the cross-correlation computation are discrete and determining the position of the peak of the cross-correlation function comprises approximating selected discrete values of the cross-correlation computation to a polynomial function, and determining a maximum of the polynomial function. Determining a maximum of the polynomial function preferably comprises computing the derivative of the polynomial function and determining the point where the derivative is zero. More specifically, determining the maximum of the cross-correlation function preferably comprises determining the index value of the maximum of the cross-correlation computation, determining the N values on either side of the maximum, where N is an integer, fitting a polynomial of order N to the resulting 2N+1 discrete values of the cross-correlation computation and computing the point where the derivative of the polynomial is zero. For example, if N is one then the polynomial is quadratic. The timing error correction preferably comprises acting upon one or more of the input or output signals with an interpolating function for removing the estimated delay. More specifically, the timing error correction preferably comprises acting upon one or more of the input or output signals with a finite impulse response interpolating filter. For example, the interpolating function may be a windowed sinc function.

According to another aspect the present invention provides a method for timing error correction in an adaptive predistortion linearized communications system comprising receiving an input signal comprising discrete signal samples from an input to the communications system, receiving an output signal comprising discrete signal samples from an output of the communications system, computing a cross-correlation function between the input and output signals, and initiating a delay-locked loop employing the results of the cross-correlation computation. The relative timing of the input and output signals is adjusted using the output of the delay-locked loop.

In a preferred embodiment of the method initiating a delay-locked loop comprises providing an initial setting to a numerically controlled oscillator using the results of the cross-correlation computation. The output of the numerically controlled oscillator is used to control an interpolator which receives and adjusts one or more of the input or output signals. The interpolator preferably corrects whole sample timing offsets employing indexing modification and corrects fractional timing offsets employing a finite impulse response filter. The numerically controlled oscillator settings are preferably updated using a filtered cross-correlation computation.

According to another aspect the present invention provides a system for timing error correction in an adaptive predistortion linearized communications system. The system comprises a first input receiving a digital input signal from an input to the communications system, a second input receiving a digital output signal from an output of the communications system, and a cross-correlation computation block computing a cross-correlation function between the input and output signal. The system further comprises a cross-correlation peak detection block for determining the position of the peak of the cross-correlation function, and a timing delay estimator for determining an estimated timing error from said position of the peak of the cross-correlation function. The system further comprises an interpolator for receiving and adjusting one or more of the digital input or output signals in response to the estimated timing error.

In a preferred embodiment of the system for timing error correction, a summation block is coupled to the cross-correlation computation block for accumulating the output of the cross-correlation computation block. The interpolator preferably comprises a finite impulse response filter. For example, the finite impulse response filter may implement a fractional interpolation operation employing a windowed sinc function. In one embodiment, the system for timing error correction may employ a numerically controlled oscillator and a loop filter, coupled to the interpolator in a delay-locked loop configuration, and a second cross-correlation block coupled to the cross-correlation block and loop filter. In this embodiment, the results of the cross-correlation computation are used to initialize the numerically controlled oscillator and the filtered output of the second cross-correlation block is used to update the numerically controlled oscillator.

Further features and aspects of the invention are set out in the following detailed description of the invention.

DETAILED DESCRIPTION OF THE INVENTION

The present invention provides a system and method for digital timing error estimation and correction in a communications system utilizing adaptive predistortion. In a preferred application, the present invention may be incorporated in an adaptive digital predistortion linearized amplifier system, and also provides an improved amplifier system, as shown in FIG. 1.

Figure 1:
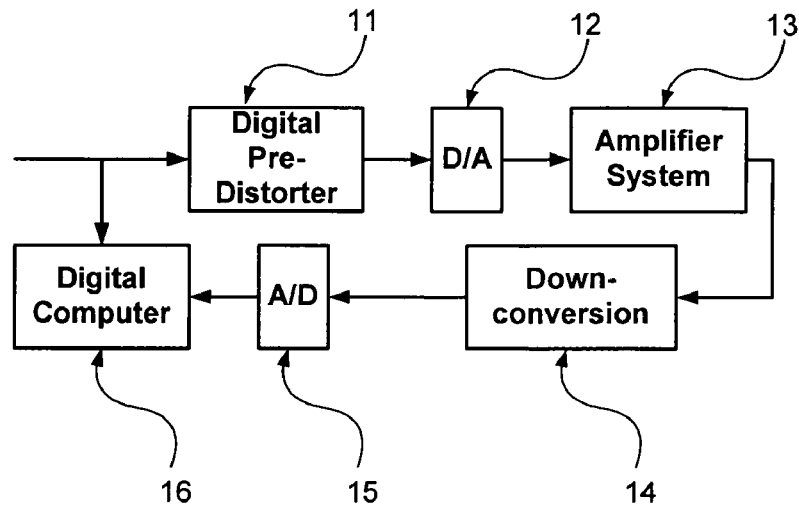
FIG. 1 is a block schematic drawing of an adaptive predistortion linearized amplifier system employing timing error compensation in accordance with the present invention.

As shown in FIG. 1, the adaptive digital predistortion linearized amplifier system includes a digital computer 16 which evaluates digitized samples of the input to the amplifier system 13 and the corresponding output of the amplifier system after down conversion 14. The amplifier system 13 may comprise frequency-conversion circuits for shifting a signal to a carrier-frequency, filtering circuits for out-of-band energy reduction and amplifier stages including a power amplifier, the construction of which are known to those skilled in the art. One or more of these stages introduces distortion. The digitized output signals are obtained from an analog-to-digital converter 15. The digitized input signals employed by computer 16 can be obtained from an analog-to-digital converter if the input signals are analog signals, or the input signals can be presented to the amplifier system in a digital format and converted to analog signals for amplification by the amplifier system, using a digital-to-analog converter 12.

By performing digital computations on the digital input and output signals, the digital computer can apply control signals to a separate predistortion circuit 11 that applies distortion to the digital input signal to the amplifier system. After conversion to an analog signal, the distorted signal is applied to the amplifier system 13. The purpose of the predistortion is to distort the input signal such that it compensates for the nonlinear transfer characteristic of the amplifier.

It is a goal of the predistorter design that the levels of residual distortion remaining at the output of the amplifier system are very low. In order to achieve this, the digital computer must have very accurate digital representations of the input signal and the output signal. Furthermore, the two signals must be aligned in time very precisely. It is necessary that the signals be aligned in time very precisely as the digital computer is analyzing how the amplifier system is altering the output signal with respect to the input signal.

In a preferred embodiment of the present invention, the input and output digital signals are analyzed using cross-correlation. By inspecting the position of the peak of the output of the cross-correlation function, the timing delay between the two signals can be determined to an accuracy of one sample. The present invention improves upon the accuracy of the timing delay estimate by applying a polynomial function to the peak of the cross-correlation function output and its adjacent samples. By using differentiation, the accuracy of the timing delay can be improved to much less than a single sample.

In the preferred embodiment, the timing delay estimated using the procedure described above is corrected using an interpolating filter. The digitized output signal from the amplifier system is passed through the interpolating filter. The output of the interpolating filter is the digitized output of the amplifier system with effectively zero timing delay with respect to the digitized input signal. In this embodiment, the effect of the timing delay estimator and the interpolating filter is to remove all of the delays introduced into the signal by the amplifier system.

The removal of the delay through the amplifier system is important, as any alterations to the signal made apparent by comparison of the input and output digitized signals in the digital processor are due to distortion effects in the amplifier system alone. Also, the timing delay through the amplifier system is tracked as the delay changes due to aging effects or temperature effects. The system and method of the present invention is advantageous in that it computes the timing delay directly instead of using a feedback loop that converges upon the desired timing delay result. The disadvantage of feedback loop methods is that they are sensitive to the input levels and power-spectrum of the digitized signals. It is difficult to design a timing delay estimator and correction system that will operate robustly with all input power-spectra that the linearized amplifier system will meet during operation use. In addition, it is not known how long the feedback loop will take to converge to the correct result in all input signal circumstances. The approach of the present invention removes all such considerations and results in a more reliable and robust design.

Next, a detailed implementation of the timing error correction system and method will be described. The timing error between the two digitized signals is computed from an estimate of the cross-correlation function between the two signals. Computations of this type are described in 'Digital Signal Processing: Principles, Algorithms and Applications, Third Edition, John G. Proakis and Dimitris G. Manolakis, Prentice Hall, New Jersey', the disclosure which is incorporated herein by reference. Equation (1) describes the cross-correlation calculation. I and O are vectors that contain the input and output digitized samples taken at the sampling rate of the system. LAGS is the number of lags over which the cross-correlation is taken; this is a design parameter and should be no less than the largest expected timing delay through the amplifier system.

$$\hat{E}_{IO}[i+LAGS+1] = \sum_{p=1+LAGS}^{LEN-LAGS} I[p]O^*[i+p], \quad -LAGS \le i \le LAGS \quad (1)$$

$$E_{IO}[i] = Re(\hat{E}_{IO}[i])^2 + Im(\hat{E}_{IO}[i])^2 \quad (2)$$

Equation (1) depicts the complex-number form of the cross-correlation computation, though it is understood that the real-number form can be used for real-valued input and output signals. In addition, equation (2) non-coherently combines the real and imaginary parts of the output of the complex-number form of the cross-correlation function described in equation (1). It is understood that a coherent form of the combination of the real and imaginary parts can be made if no phase rotation is expected. It is also understood that equation (1) describes a particular formulation of the cross-correlation, and that other formulations of the cross-correlation are equally suitable.

The timing delay in a whole number of samples is the index, i, of the maximum value of equation (1). In the preferred approach of the present invention the initial timing error estimate is further refined. The procedure is to first find the value of the maximum of the cross-correlation function and then to record the values of the maximum cross-correlation and the N values either side of the maximum. The next stage is to fit a polynomial of order 2N to the resulting 2N+1 data points. The next stage is to find the position of the turning point of the polynomial by finding the point at which the derivative is zero.

Figure 2:
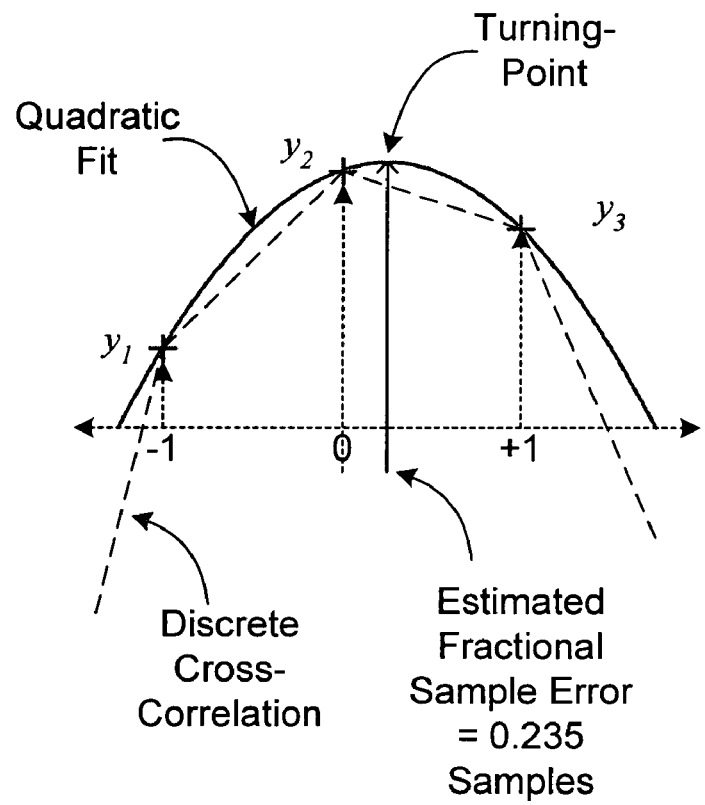
FIG. 2 is a graphical representation of a quadratic polynomial fit to a cross-correlation function employed in timing error estimation in accordance with a preferred embodiment of the present invention.

As an example, the procedure described above is outlined in more detail for the case where N is selected to be equal to 1; in this case the polynomial is a second-order or quadratic. The value of the peak of the cross-correlation estimation, given by equation (1), is denoted by $y_2$. The two adjacent samples are denoted by $y_1$ and $y_3$. This is illustrated in FIG. 2. Note that the timing values in the x-axis are chosen to be −1, 0 and +1. These values are for convenience only, and it is understood that any set of x-axis values may be used (for example 1, 2, 3, or 0.5, 0, 0.5). The following steps are followed to obtain the improved estimate of the timing delay:

1. The polynomial is of the form $y=ax^2+bx+c$
2. At x=−1, we have $y_1=a−b+c$
3. At x=0, we have $y_2=c$
4. At x=1, we have $y_3=a+b+c$
5. Using 3, $2a=y_1+y_3−2y_2$
6. Using 3, $2b=y_3−y_1$
7. The first derivative of 1 w.r.t. x is $2ax+b$
8. The turning-point is at $x_{TP}=−b/2a=\frac{1}{2}(y_1−y_3)/(y_1+y_3−2y_2)$ The procedure is set out below:
Let p=peak position in cross-correlation
Let $y_2=E_{IO}[p]$
Let $y_1=E_{IO}[p-1]$
Let $y_3=E_{IO}[p+1]$
Fractional_error=$0.5*(y_1-y_3)/(y_1+y_3-2y_2)$
p=p+fractional_error;
TimingError=LAGS+1−p Once the initial timing estimate is made, the timing error filters are updated.

Figure 3:
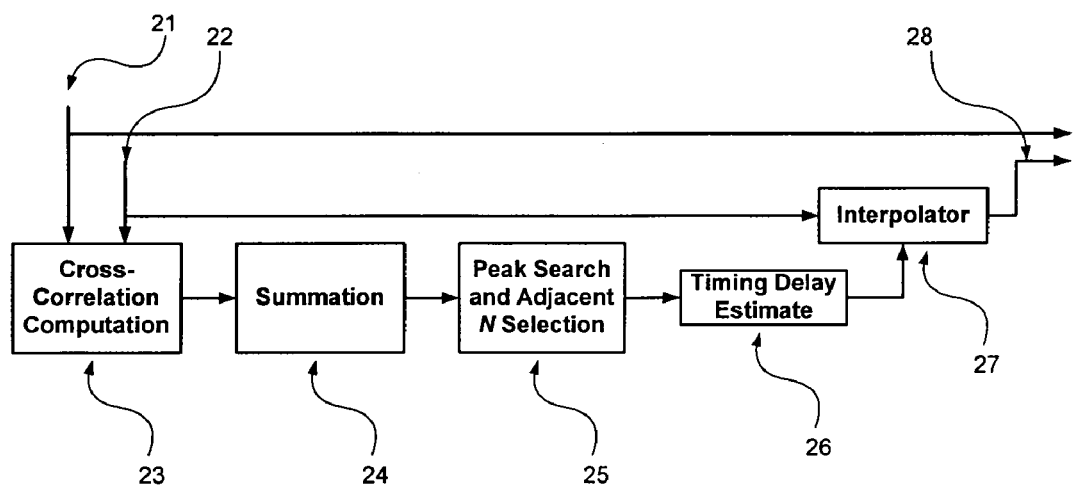
FIG. 3 is a functional block diagram of a timing error estimation and elimination system in accordance with the present invention.

A first embodiment of the digital timing error estimation and correction circuit of the invention is shown in FIG. 3. It is understood that the blocks shown in this diagram can exist in hardware, software or a combination of both. These blocks form part of the digital computer 16 of FIG. 1.

The cross-correlation computation of equation (1), above, is computed in block 23 of FIG. 3. The inputs to this block are the digital inputs to the linearized amplifier system 21 and the digitized outputs from the amplifier system 22. The digitized output from the amplifier system corresponds to the digitized outputs of A/D converter 15 in FIG. 1. Summation block 24, performs the non-coherent accumulation of the correlation outputs. In addition, it is understood that summation block 24 can be used to accumulate successive outputs of the cross-correlation unit 23 to further improve the estimation accuracy by virtue of the well-understood process of noise averaging.

Block 25 computes the peak searching, which presents 2N+1 outputs to block 26. Block 26 performs the estimation of the timing error accurate to a fraction of a sample. An example of the computation performed by block 26, using the N=1 (quadratic case), is shown in computation-step 8, above. Finally, the whole-sample and fractional-sample timing delay is passed from block 26 to the interpolator block 27. The output of the interpolator block 28 is then time aligned with the digital input 21.

In this embodiment, an interpolating filter is preferably used to correct the timing error. The timing error is updated periodically to track aging and temperature related drifts in the time delay through the amplifier system. This approach reduces the computational burden on the digital computer, and is a robust solution if the sampling rates of the input signal and the A/D and D/A converters are known to be equal. In this case the timing delay is a constant value, barring the long term drifts in the analog components described above.

If the sampling rates of the A/D and D/A converters are not equal—for example, if there is a small frequency error between the sampling rates—then the timing delay estimate will not be constant and will need to be continuously re-evaluated. (This situation is addressed by the second embodiment—discussed below.)

In this embodiment, an interpolating filter of the Farrow type may be employed, as described in "A Continuously Variable Digital Delay Element, C. W. Farrow; Circuits and Systems, 1988, IEEE International Symposium, Jun. 7–9, 1988, pages 2641–2645, vol. 3", the disclosure of which is incorporated herein by reference, though it is understood that any interpolating filter is applicable. In this case, the fractional sample retiming filter performs timing corrections of any positive fraction of a sample. Though it is understood that interpolating filters that correct by negative fractions of a sample, or both positive and negative fractions of a sample can be also be used. Whole-sample timing offsets are corrected by using an indexing modification that is understood by those skilled in the art of digital signal processing. The remaining fraction of a sample delay is inserted using an FIR filter that has tap-weights approximately equal to a low-pass filter interpolated by a sinc(x) function.

Figure 4:
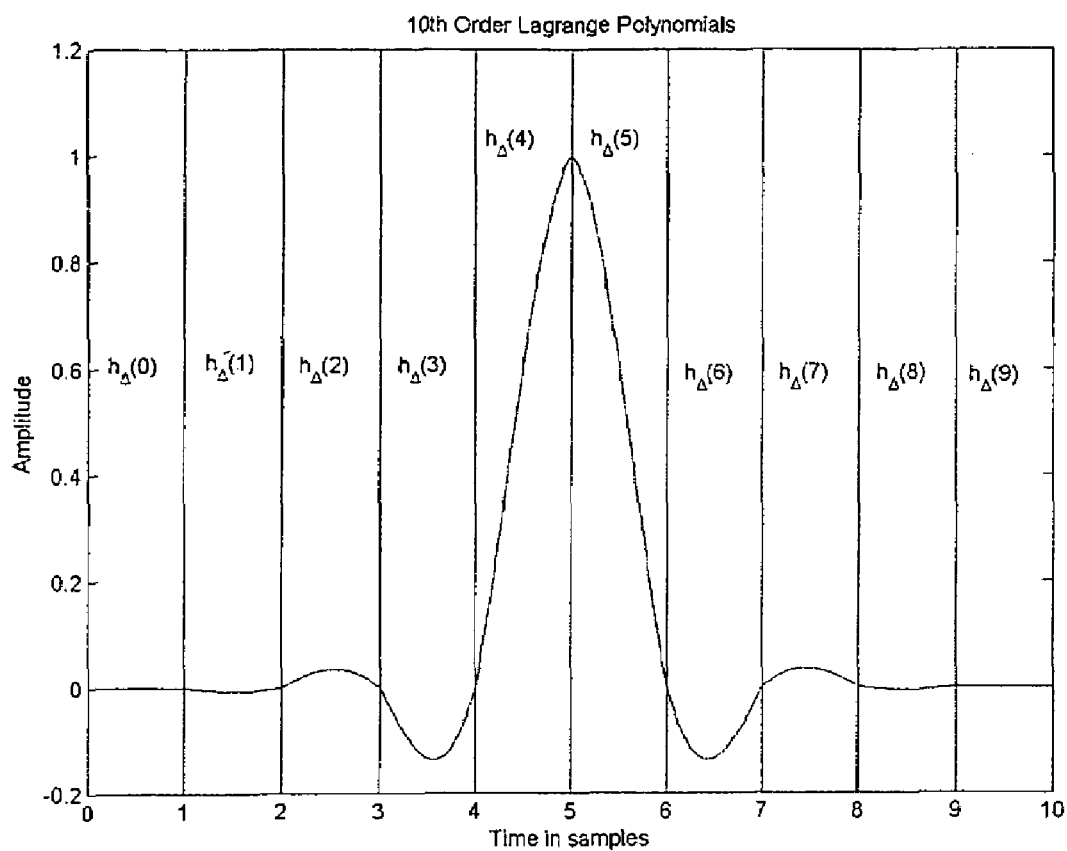
FIG. 4 is a graphical representation of piecewise polynomial fitting to a windowed sinc(x) function employed in timing error elimination in accordance with the present invention.

The FIR tap-weights are re-calculated every time the fractional part of the timing delay is changed by the timing delay estimator 26. The tap-weights are obtained from a piecewise polynomial approximation to the appropriate overall filter response. The principle is illustrated in FIG. 4. This is, in general, the Farrow approach for calculating impulse response taps. The actual interpolators constructed by Farrow, used the polynomial approximation for continuous updating of taps. See "A Continuously Variable Digital Delay Element, C. W. Farrow; Circuits and Systems, 1988, IEEE International Symposium, Jun. 7–9, 1988, pages 2641–2645, vol. 3". This implementation of the interpolator is different but the principle of using the piecewise polynomial approximation is preferably used here to save digital computer computation overhead.

Figure 5:
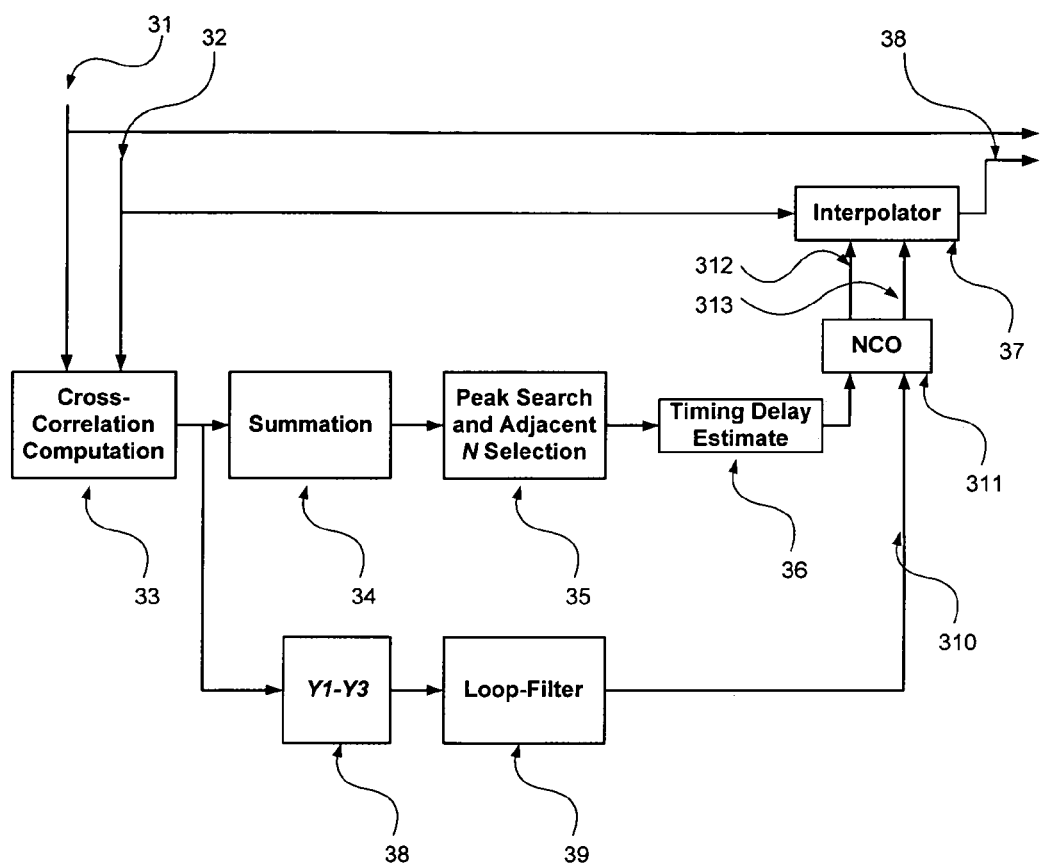
FIG. 5 is a functional block diagram of a timing error estimation and elimination system in accordance with an alternate embodiment of the present invention.

Next, referring to FIG. 5 a second embodiment of the digital timing error correction circuit will be described. In this embodiment it is recognized that many of the problems associated with delay locked loop approaches to timing error correction are associated with the initial convergence of the feedback loops. Once convergence has been achieved, many of the design issues identified can be mitigated by the selection of a very low loop-bandwidth. Although a low loop-bandwidth may be considered undesirable in other applications, the disadvantages of a low loop-bandwidth do not apply in the linearized amplifier system case, as there are no independent frequency reference and Doppler-shift problems to overcome. However the problem of initial convergence is still a major difficulty with a delay-locked loop approach, which the present invention overcomes.

By inspection of step 8 in the first embodiment above, it is recognized that setting the denominator of the division to 1 reduces the computation to that of a delay-locked loop. See, "Spread Spectrum Communications Handbook, M. K. Simon, J. K. Omura, R. A. Scholtz, B. K. Levitt, McGraw-Hill Professional, 2001, ISBN: 0071382151", the disclosure of which is incorporated herein by reference. It is therefore a useful step to use the computation of step 8 to obtain an initial very accurate timing delay estimate. Subsequently, tracking of slow aging and temperature-related time-delay changes can be made through a very low loop-bandwidth delay-locked loop.

By using a well known numerically controlled oscillator (NCO) approach, for example, as described in Lars Erup, Floyd M. Gardner and Robert A. Harris, "Interpolation in Digital Modems—Part II: Implementation and Performance, IEEE Transactions on Communications, vol. 41, no. 6, June 1993, pp. 998–1108" the disclosure of which is incorporated herein by reference, the present invention can be used to provide an improved initial timing delay estimate. The initial estimate is used to initialize the NCO 311, and therefore the interpolating filter 37 along line 312. The delay-locked loop early and late correlations are computed by block 38 of FIG. 5, and the difference between the early and late correlations (corresponding to $Y_1$ and $Y_3$ of step 8 in the first embodiment) are filtered by the loop-filter 39. The output of the loop-filter 310 is accumulated in the NCO 311, which has an initial value set by the output of block 36. The output of blocks 33, 34, 35 and 36 follows the procedures set out in the first embodiment discussed above.

For each iteration, the accumulated value in the NCO is updated according to the following equation:

$$\text{NCO\_ACC}(T) = \text{NCO\_ACC}(T-1) - \text{LOOP\_FILTER\_OUTPUT} \quad (3)$$

The whole-sample delay may be computed within the NCO 311, using the following equation 4. This employs the principle outlined in Lars Erup, Floyd M. Gardner and Robert A. Harris, "Interpolation in Digital Modems—Part II: Implementation and Performance, IEEE Transactions on Communications, vol. 41, no. 6, June 1993, pp. 998–1108".

$$\text{WHOLE\_TIMING\_DELAY}(T) = \text{floor}(\text{NCO\_ACC}(T)) \quad (4)$$

The fractional-sample delay is computed within the NCO, using the following equation 5. This also employs the principle outlined in Lars Erup, Floyd M. Gardner and Robert A. Harris, "Interpolation in Digital Modems—Part II:

Implementation and Performance, IEEE Transactions on Communications, vol. 41, no. 6, June 1993, pp. 998–1108".

$$\text{FRACTIONAL\_TIMING\_DELAY}(T) = \text{NCO\_ACC}(T) - \text{WHOLE\_TIMING\_DELAY} \quad (5)$$

The updated whole and fractional timing offsets are provided to interpolator 37 along line 313. Whole sample timing offsets are corrected by using an indexing modification that is understood by those skilled in the art of digital signal processing. The remaining fraction of a sample delay is preferably inserted using an FIR filter that has tap-weights approximately equal to a low-pass filter interpolated by a sinc(x) function that is known to those skilled in the art of signal processing.

The system and method of the present invention thus provides for rapidly estimating the timing error between two similar signals in a manner that is tolerant of the power of each of the signals; tolerant of the power spectral-density of the signals; has a pre-determined time required to obtain an good estimate; provides a 'one-shot' estimate of the timing error; provides an explicit estimate of the timing error (in seconds, or any desired units); and is accurate enough to perform predistortion adaptation calculations.

Although specific detailed embodiments have been described these should not be viewed as limiting in nature as a variety of modifications may be provided employing the teachings of the present invention, as will be appreciated by those skilled in the art.

What is claimed is:

1. A method for timing error correction in an adaptive predistortion linearized communications system, comprising:
   receiving an input signal comprising discrete signal samples from an input to the communications system;
   receiving an output signal comprising discrete signal samples from an output of the communications system;
   estimating a timing delay between said input and output signals to a fraction of a sample timing; and
   correcting the timing error between said input and output signals using said estimated timing delay;
   wherein estimating a timing delay comprises computing a cross-correlation function between said input and output samples and determining the position of the peak of the cross-correlation function;
   wherein the values of the cross-correlation computation are discrete and wherein determining the position of the peak of the cross-correlation function comprises approximating selected discrete values of the cross-correlation computation to a polynomial function.

2. A method for timing error correction as set out in claim 1, wherein determining the position of the peak of the cross-correlation function further comprises determining a maximum of the polynomial function.

3. A method for timing error correction as set out in claim 2, wherein determining a maximum of the polynominal function comprises computing the derivative of the polynomial function and determining the point where the derivative is zero.

4. A method for timing error correction as set out in claim 1, wherein the timing error correction comprises acting upon one or more of the input or output signals with an interpolating function for removing the estimated delay.

5. A method for timing error correction as set out in claim 4, wherein the timing error correction comprises acting upon one or more of the input or output signals with a finite impulse response interpolating filter.

6. A method for timing error correction as set out in claim 4, wherein the interpolating function is a windowed sinc function.

7. A method for timing error correction in an adaptive predistortion linearized communications system, comprising:
   receiving an input signal comprising discrete signal samples from an input to the communications system;
   receiving an output signal comprising discrete signal samples from an output of the communications system;
   estimating a timing delay between said input and output signals to a fraction of a sample timing; and
   correcting the timing error between said input and output signals using said estimated timing delay;
   wherein estimating a timing delay comprises computing a cross-correlation function between said input and output samples and determining the position of the peak of the cross-correlation function;
   wherein determining the position of the peak of the cross correlation function comprises determining the index value of the maximum of the cross-correlation computation, determining the N values on either side of the maximum, where N is an integer, fitting a polynomial of order N to the resulting 2N+1 discrete values of the cross-correlation computation and computing the point where the derivative of the polynomial is zero.

8. A method for timing error correction as set out in claim 7, wherein N is one and the polynomial is quadratic.

9. A method for timing error correction in an adaptive predistortion linearized communications system, comprising:
   receiving an input signal comprising discrete signal samples from an input to the communications system;
   receiving an output signal comprising discrete signal samples from an output of the communications system;
   computing a cross-correlation function between said input and output signals;
   initiating a delay-locked loop employing the results of said cross-correlation computation; and
   adjusting the relative timing of said input and output signals to a fraction of a sample timing using the output of said delay-locked loop.

10. A method for timing error correction as set out in claim 9, wherein initiating a delay-locked loop employing the results of said cross-correlation computation comprises providing an initial setting to a numerically controlled oscillator using the results of said cross-correlation computation.

11. A method for timing error correction as set out in claim 10, wherein adjusting the relative timing of said input and output signals comprises using the output of said numerically controlled oscillator to control an interpolator which receives and adjusts one or more of the input or output signals.

12. A method for timing error correction as set out in claim 11, wherein said interpolator corrects whole sample timing offsets employing indexing modification and fractional timing offsets employing a finite impulse response filter.

13. A method for timing error correction as set out in claim 10, further comprising updating the numerically controlled oscillator settings using a filtered cross-correlation computation.

14. A system for timing error correction in an adaptive predistortion linearized communications system, comprising:

a first input receiving a digital input signal from an input to the communications system;

a second input receiving a digital output signal from an output of the communications system;

a cross-correlation computation block computing a cross-correlation function between said input and output signals;

a cross-correlation peak detection block for determining the position of the peak of the cross-correlation function;

a timing delay estimator for determining an estimated timing error from said position of the peak of the cross-correlation function; and an interpolator receiving and adjusting one or more of the digital input or output signals to a fraction of a sample timing in response to said estimated timing error, wherein said interpolator comprises a finite impulse response filter.

15. A system for timing error correction as set out in claim 14, further comprising a summation block coupled to the cross-correlation computation block for accumulating the output of said cross-correlation computation block.

16. A system for timing error correction as set out in claim 14, wherein said finite impulse response filter implements a fractional interpolation operation employing a windowed sinc function.

17. A system for timing error correction as set out in claim 14, further comprising a numerically controlled oscillator and a loop filter, coupled to said interpolator in a delay-locked loop configuration.

18. A system for timing error correction as set out in claim 17, further comprising a second cross-correlation block coupled to said cross-correlation block and loop filter, wherein the results of said cross-correlation computation are used to initialize said numerically controlled oscillator and the filtered output of said second cross-correlation block is used to update said numerically controlled oscillator.

* * * * *